United States Patent [19]

Yamamuro et al.

[11] Patent Number: 4,915,997
[45] Date of Patent: Apr. 10, 1990

[54] OPTICAL INFORMATION RECORDING MEDIUM

[75] Inventors: Tetsu Yamamuro, Yamato; Yutaka Ueda, Yokohama; Eiji Noda, Kawasaki, all of Japan

[73] Assignee: Ricoh Company, Ltd., Tokyo, Japan

[21] Appl. No.: 252,559

[22] Filed: Oct. 3, 1988

[30] Foreign Application Priority Data

Oct. 6, 1987 [JP] Japan ................. 62-251874
Jul. 18, 1988 [JP] Japan ................. 63-179983

[51] Int. Cl.$^4$ ............................... B32B 3/02
[52] U.S. Cl. ........................... 428/64; 428/65; 428/913; 369/284; 369/288; 430/945; 346/76 L; 346/135.1; 523/349; 522/141; 522/146; 522/170
[58] Field of Search ............... 428/64, 65, 913; 369/284, 288; 430/945; 346/76 L, 135.1; 523/349

[56] References Cited

U.S. PATENT DOCUMENTS

| | | | |
|---|---|---|---|
| 4,504,842 | 3/1985 | Odawara | 369/284 |
| 4,647,402 | 3/1987 | Tamura | 523/459 |
| 4,683,562 | 7/1987 | Matsui et al. | 369/284 |
| 4,686,543 | 8/1987 | Tani et al. | 369/284 |
| 4,731,620 | 3/1988 | Yabe et al. | 369/284 |

Primary Examiner—Patrick Ryan
Attorney, Agent, or Firm—Cooper & Dunham

[57] ABSTRACT

An optical information recording medium is disclosed which comprises a pair of substrates at least one of which has a recording layer on one side thereof and which are placed opposingly to each other so that said recording layer is positioned on the inside and are bonded to each other by adhesive layer(s) with or without spacer(s) therebetween to form a sealed structure, wherein said adhesive layer is composed of a cured adhesive material formed from (a) an epoxy resin, (b) a photolyzable organosilicon compound and (c) an aluminum complex compound, said photolyzable organosilicon compound being a silicon compound having at least one phenyl group which has at least one fluorine atom and at least one o-nitrobenzyloxy group which may have a substituent. The said photolyzable oganosilicon compound may be replaced by a mixture of (b-1) a silicon compound having at least one phenyl group having at least one fluorine atom and at least one o-nitrobenzyloxy group which may have a substituent, and (b-2) a silicon compound having at least one phenyl group having no substituents and at least one o-nitrobenzyloxy group which may have a substituent.

5 Claims, 1 Drawing Sheet

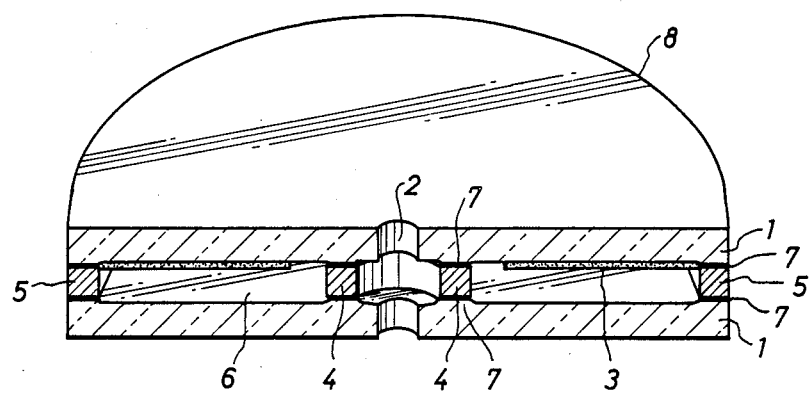

OPTICAL INFORMATION RECORDING MEDIUM

BACKGROUND OF THE INVENTION

The present invention relates to a sealed type appropriately-shaped information recording medium having a recording layer provided on the surface of at least one of the substrates for making optical recording and reproduction of information.

In manufacture of optical information recording media by sealing a pair of disc substrates with a spacer, adhesion techniques using an epoxy adhesive have been employed for bonding the substrates and spacer. Conventional epoxy adhesives can be reckoned as an excellent adhesive in that they exert no such baneful effects as reducing reflectance of the recording material of the disc and reducing the S/N ratio. However, such epoxy adhesives, because of their hot-curing property, may cause deformation of the substrates when heated and are also poor in productivity as a long time is required for curing and also jigs for fixing members during this operation are necessary.

For eliminating these problems, ultraviolet-curing resins containing a radical photopolymerization initiator have been developed and are now practically used as a new sealing adhesive. These ultraviolet-curing resins, although free of said defects of epoxy adhesives, have given rise to the new problem that the squeezed-out portion of the sealing adhesive, when contacted with air, remains uncured due to their anaerobic nature, this resulting in causing a reduction of reflentance of the recording material of the disc or a reduction of S/N ratio.

In addition, another new epoxy sealing adhesives comprising a cation polymerization photoinitiator which is selected from onium salts, the counterions being, for example, $SbF_6^-$, $PF_6^-$, $As_2F_5^-$, and $BF_4^-$, were used. But, these photoinitiators of the onium salt type, although free of said defects of ultraviolet-curing resins containing a radical photopolymerization initiator, gave also rise to the new problem that the optical recording medium containing organic dyes are attacked with the strong acid produced on curing possibly from the counter ion.

As a solution to said problem, the present inventors had previously proposed use of an adhesive composed of (a) an epoxy resin, (b) a photolyzable organosilicon compound and (c) a metal complex type composite catalyst. After this proposal, the present inventors have pursued their further studies on the photolyzable organosilicon compounds in this type of adhesives, and as a result, found that a photolyzable organosilicon compound having both of o-nitrobenzyloxy group and fluorine-containing phenyl group is especially excellent as a component of sealing adhesive for the optical information recording media.

An object of the present invention is to provide an improved sealing technique for the sealed type optical information recording media.

SUMMARY OF THE INVENTION

According to the present invention, there is provided an optical information recording medium comprising a pair of disc substrates at least one of which has a recording layer on one side and which are placed opposingly to each other so that said recording layer is positioned on the inside and are bonded to each other by adhesive layer(s) with or without spacer(s) therebetween to form a sealed structure, wherein said adhesive layer is composed of a cured adhesive material formed from (a) an epoxy resin, (b) a photolyzable organosilicon compound and (c) an aluminum complex compound, said photlyzable organosilicon compound being a silicon compound having at least one phenyl group having at least one fluorine atom and at least one o-nitrobenzyloxy group which may have a substituent.

The present invention also provides an optical information recording medium comprising a pair of disc substrates at least one of which has a recording layer on one side thereof and which are placed opposingly to each other so that said recording layer is positioned on the inside and are bonded to each other by adhesive layer(s) with or without spacer(s) therebetween to form a sealed structure; wherein said adhesive layer is composed of a cured adhesive material formed from (a) an epoxy resin, (b) a photolyzable organosilicon compound and (c) an aluminum complex compound, said photolyzable organosilicon compound being a mixture of (b-1) a silicon compound having at least one phenyl group having at least one fluorine atom and at least one o-nitrobenzyloxy group which may have a substituent, and (b-2) a silicon compound having at least one phenyl group having no substituents and at least one o-nitrobenzyloxy group which may have a substituent.

Among various combinations of components (a), (b) and (c) and components (a), (b-1), (b-2) and (c), those which will be exemplified in EXAMPLE are preferred.

BRIEF EXPLANATION OF THE DRAWING

FIG. 1 is a diagrammatic structural illustration of a sealed type information recording medium according to this invention. 1: disc substrate, 4, 5: spacer, 7: adhesive layer.

DETAILED DESCRIPTION OF THE INVENTION

The "epoxy resin" used as a first essential component of the adhesive according to this invention is a compound having two or more epoxy groups in one molecule and may be roughly classified into the following types:

(a) Bisphenol A-epichlorohydrin type (abbreviated as epi-bis type);

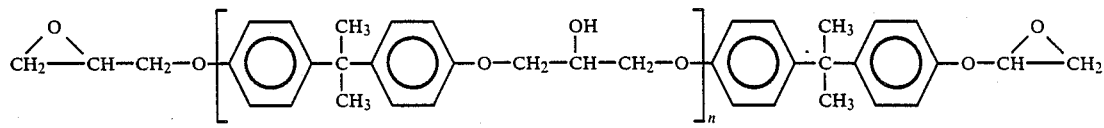

(n = 0-16)

(b) Novolak type;

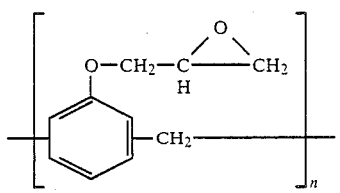

(c) Epoxy resins having an alicyclic structure;
The resins have an alicyclic epoxy of the formula

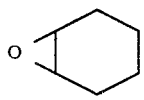

in the molecule.
(d) Long chain aliphatic type;

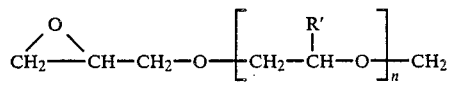

(e) Brominated epoxy resins;
The resins are made using brominated bisphenol A as base material.
(f) Glycidyl ester type;
(g) Heterocyclic type;
This includes hydantoin type and TGIC type.

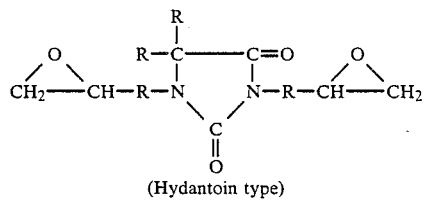

(Hydantoin type)

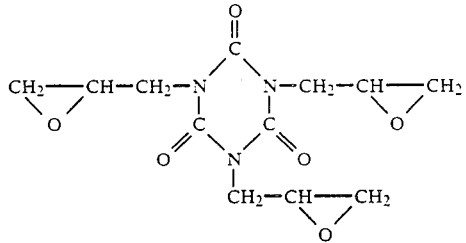

(TGIC type)

Some of the typical examples of said epoxy resins, as selected from the commercially available ones, are shown below:

Araldite AY101, AZ102, AY103, AY105, AW106, AV121N, AV121B, AV123B, AV129, AW134, AW136H, AW136N, AW1201, AV138, AV101, AV103, AT1 and AZ15; GY250, 260, 6071 and 6099; ECN1280; CY208, 8011, 192, 350 and 362 (available from CIBA GEIGY LTD.);

Lixonbond 1001A, 1002A and 1004A (available from CHISSO CO., LTD.);

Denacol EX-810, 811, 851, 830, 832, 841, 861, 911, 941, 920, 921, 931, 211, 212, 221 and 721; Denacol EX-313, 314, 321, 411, 421, 521, 611, 612, 614, 614B and 622 (available from NAGASE SANGYO CO., LTD.);

Epikote 152, 828 and 1001 (available from SHELL CHEMICAL CO.);

ERL4221 (available from UNION CARBIDE CO., LTD.); and

EHPE-3150 (available from DICEL CHEMICAL INDUSTRIES CO., LTD.).

These epoxy type resins may be used either singly or in combination.

In particular, examples of the epoxy compounds having an alicyclic structure are Celloxide 2021, 2000 and 3000, EHPE-3150-1 and Spiroepoxy (available from DICEL CHEMICAL INDUSTRIES CO., LTD.);

ERL4206, 4289, 4299 and 4234 (available from UNION CARBIDE CO., LTD.);

Araldite CY177 and 179 (available from CIBA GEIGY LTD.) and

Vinylcyclohexene epoxide and vinylcyclohexene diepoxide.

Typical structural examples of the epoxy compounds having an alicyclic structure are shown below.

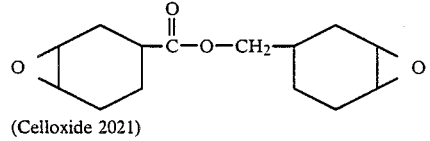

(Celloxide 2021)

350–450 mPas (25° C.)
b.p. 168° C./133 Pa

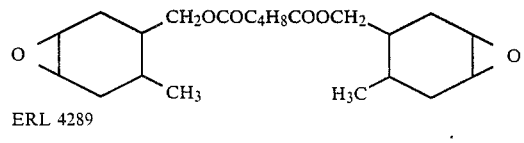

ERL 4289

800–1100 mPas (25° C.)
b.p. 258° C./1.33 KPa

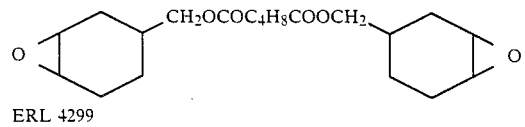

ERL 4299

550–750 mPas (25° C.)
b.p. 258° C./1.33 KPa

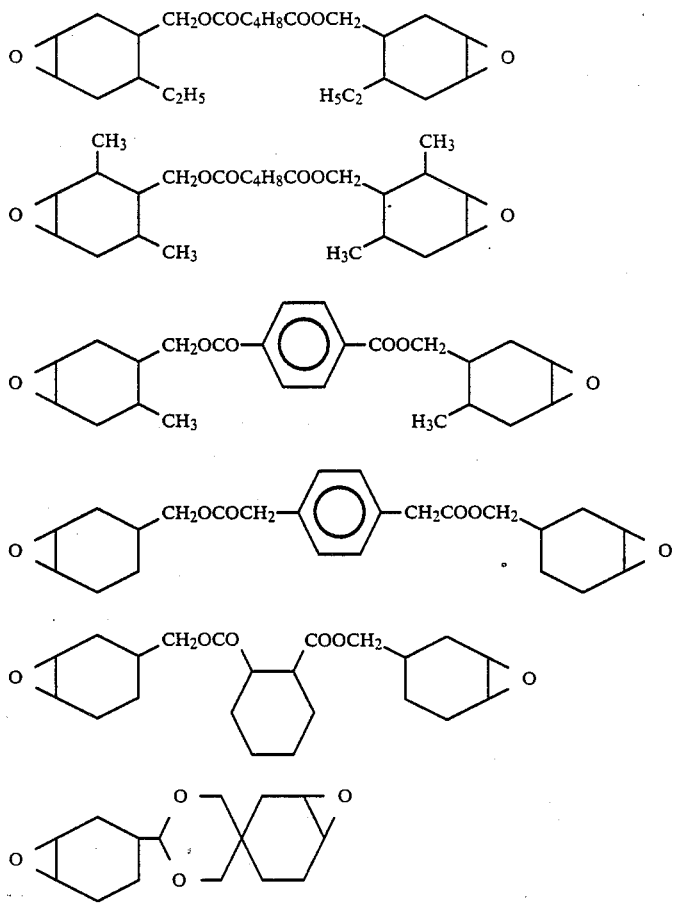

ERL 4234 (same as CY175 of CIBA GEIGY)

7000–17000 mPas (33° C.)
b.p. >250° C./101 Kpa

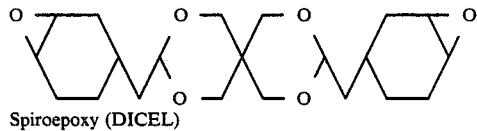

Spiroepoxy (DICEL)

(solid at room temperature)

Said epoxy compounds having an alicyclic structure may be used either singly or in combination or as a mixture with the epoxy compounds having no alicyclic structure, for example, epoxy resins such as EHPE-3150

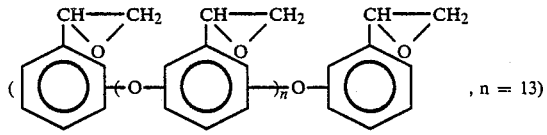

(DICEL) and epi-bis type epoxy resins such as Epikote 826 (SHELL CHEMICAL).

Examples of aluminum compounds used as a second essential component of the adhesive according to this invention include the following: tris(ethoxyacetylacetato)aluminum, tris(oxyanto)aluminum tris(methoxy)aluminum, tris(ethoxy)aluminum, tris(isopropoxy)aluminum, tris(phenoxy)aluminum, isopropoxydiethoxyaluminum, tris(butoxy)aluminum, tris(acetoxy)aluminum, tris(stearato)aluminum, tris(butylato)aluminum, tris(propionato)aluminum, tris(isopropionato)aluminum, tris(acetylacetonato)aluminum, tris(trifluoroacetylacetonato)aluminum, tris(pentafluoroacetylacetonato)aluminum, tris(ethylacetaceto)aluminum, tris(salicylaldehydato)aluminum, tris(diethylmalorato)aluminum, tris(propylacetaceto)aluminum, tris(butylacetaceto)aluminum, tris(dipivaloylmetanato)aluminum, diacetylacetanatodipivaloylmetanatoaluminum, tris(ethylacetacetonato)aluminum, tris(tert-butylacetacetato)aluminum, tris(isobutylacetacetato)aluminum, tris(ethylsalicylato)aluminum, tri(phenylsalicylato)aluminum, and tris(orthoacetylphenolato)aluminum,

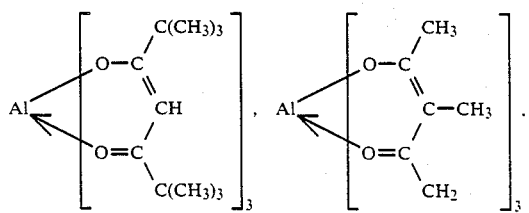

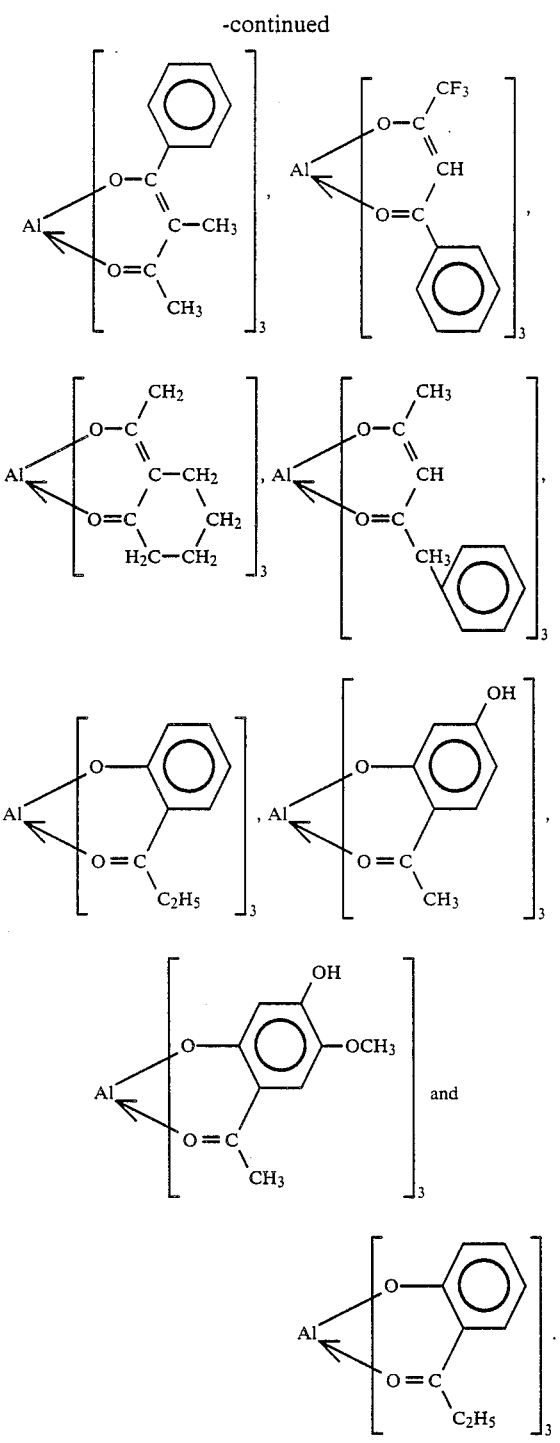

compound. When using the silicon compound according to this invention, the photosetting rate at low temperatures becomes higher than when using the conventional silicon compounds. This is considered attributable to the formation of a silanol having stronger acidity since the fluorine atom has a greater electronegativity than the chlorine atom.

The silicon compound used in this invention is generally selected from those represented by the following formula (I):

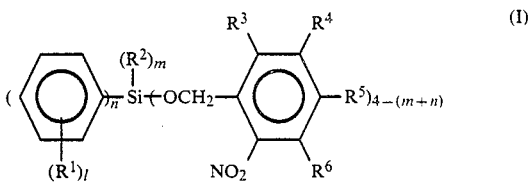

In the above formula (I), $R^1$ represents a fluorine atom ($-F$), and l represents an integer of 1 to 5. When a plural of substituent $R^1$ are bonded to a benzene nucleus, these $R^1$'s may be the same or different from each other. $R^2$ represents a lower alkyl, lower unsaturated alkyl or aromatic group, and when plural $R^2$'s are bonded to the silicon atom, the $R^2$'s may be the same or different from each other. $R^3$, $R^4$, $R^5$ and $R^6$ may be the same or different from each other and represent respectively a hydrogen atom, a halogen atom or an organic group such as alkyl, aryl, nitro, cyano or alkoxy. Letter m represents an integer of 0, 1 or 2, and n represents an integer of 1, 2 or 3, but $m+n \leq 3$.

Concrete examples of the silicon compounds represented by the above general formula (I) include those of the following formulae:

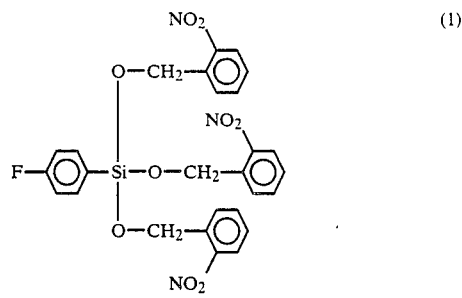

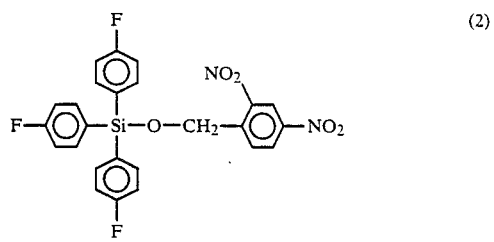

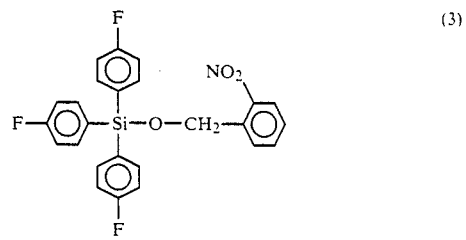

These aluminum complex compounds may be used either singly or in combination in an amount within the range of from 0.01 to 10% by weight, preferably 0.5 to 5% by weight, based on the epoxy resin.

In the present invention, a silicon compound having at least one phenyl group having at least one fluorine atom and at least one o-nitrobenzyloxy group which may have a substituent is used as a third essential component of the adhesive. This silicon compound is photolyzable and stable in the dark place, but when exposed to ultraviolet light, it is quickly decomposed to form a silanol. Polymerization of the epoxy compound is initiated by the action of said silanol and aluminum complex

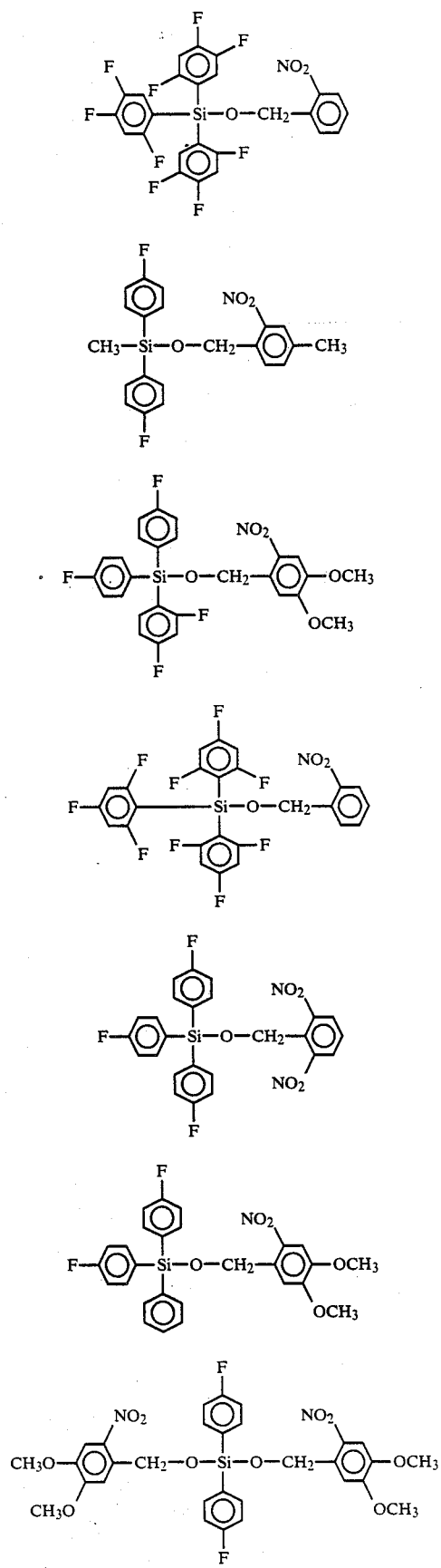
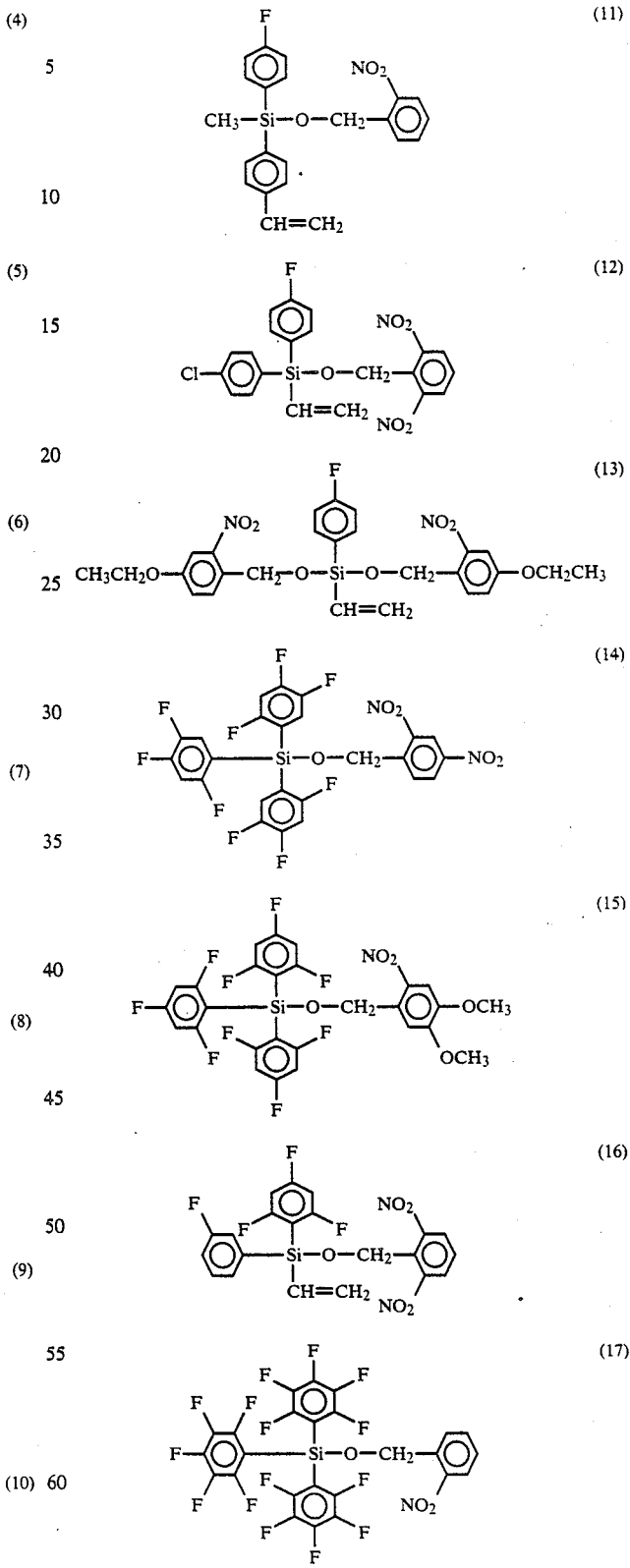
The silicon compound used in this invention can be obtained by the following reaction according to the method described in Japanese Patent Application Laid-Open No. 58-17438:

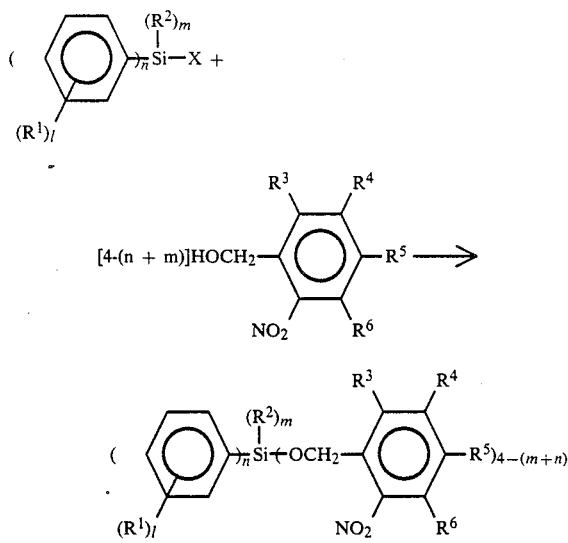

wherein X represents a halogen atom, and $R^2$ to $R^6$, m, n and l have the same meanings as defined above.

The above reaction is carried out in a tetrahydrofuran solvent in the presence of a base such as triethylamine at 60° to 70° C. for a period of about 0.5 to 48 hours.

The amount of the silicon compound used in the present invention is in the range of from 0.5 to 15% by weight, preferably 2 to 12% by weight, based on the epoxy resin.

The silicon compound of the formula (I) of this invention may be used as an admixture with an o-nitrobenzylsilyl ether compound, i.e., a silicon compound having at least one phenyl group having no substituents and at least one optionally substituted o-nitrobenzyloxy group, capable of giving a satisfactorily longer pot life, such as (o-nitrobenzyloxy)triphenylsilane, bis(o-nitrobenzyloxy)diphenylsilane or the like. In this case, the amount of said o-nitrobenzylsilyl ether compound added should be in the range of from 0.1 to 1.5 time, preferably 0.2 to 1.0 time the amount by weight of the silicon compound represented by the formula (I).

Accordingly, the amount of the mixture of the silicon compound and said o-nitrobenzylsilyl ether compound is 0.55 to 37.5% by weight, preferably 0.60 to 30% by weight, based on the epoxy resin.

When using said mixture, the pot life remains substantially unchanged but the curing rate increases correspondingly to the addition of the o-nitrobenzylsilyl ether compound to the silicon compound of the formula (I).

In the present invention, a photosensitizer such as benzophenone, amine, benzoin ether, Erythrocin B or the like may be added to the photolyzable organosilicon compound and metal complex compound for promoting the photolysis of said organosilicon compound. It is also possible to add zeolite, porous silica, titanium oxide or like material for increasing the activity of said metal complex compound.

The photopolymerizable adhesive of this invention is cured by such method as normal-temperature photosetting, photosetting under heating, postcuring after photosetting, etc. The wavelength required for photosetting is usually 200 to 500 nm, preferably 300 to 400 nm. The light irradiation time, although differing according to the epoxy resin composition and the type of catalyst used, is usually from 5 seconds to 150 minutes, preferably from 15 seconds to 6 minutes. The heating temperature in the case of photosetting under heating, although variable depending on the epoxy resin composition and the type of catalyst used, is usually 20° to 200° C., preferably 25° to 80° C. As light source, there can be used high pressure mercury lamp, carbon arc lamp, xenone lamp, argon glow discharge tube and the like. Postcuring after photosetting, although subject to change according to the epoxy resin composition and the type of the catalyst used, is usually conducted at a temperature of 20° to 180° C., prefrably 25° to 120° C., for a period not exceeding 10 hours, preferably not exceeding 5 hours.

The adhesive of this invention cured in the manner described above has very excellent chemical properties as a sealing material for optical information recording media, such as little baneful effect to the recording layer and strong adhesion.

The structure of the sealed type information recording medium of this invention will be described with reference to the accompanying drawing.

Each of the disc substrates 1, 1 is made of, for example, a transparent plastic plate and has a fitting hole 2 at its center. A recording layer 3 is formed on one side of at least one of said substrates 1, 1. Said substrates 1, 1 are placed opposing to each other with the intermediate of concentrically disposed inner spacer 4 and outer spacer 5 so that said recording layer 3 is positioned on the inside, and are bonded to each other through said spacers by using the adhesive layers 7 so that a spacer 6 is formed between said both substrates 1, 1, thereby constituting an information recording medium 8. All of the recording materials commonly employed for the recording media can be used for forming said recording layer 3. For example, such recording layer may be formed from a thin film of a metal such as Te, Al or the like or a thin film of an organic dye such as polymethine dye (cyanine dye, merocyanine dye, etc.). Although not shown in the drawing, said recording layer 3 may be formed on one side of both of said substrates 1, 1.

Substrates may, as has been mentioned, be made of transparent plastic, and the adhesive compositions of the present invention are advantageously applied to acryl or polycarbonate substrates.

In the sealed type information recording medium of this invention, the adhesive used for sealing thereof has the following advantageous characteristics:
(1) High in adhesive force,
(2) Gives no baneful effect on the recording material,
(3) High in photosetting speed at low temperatures,
(4) Photosettable at low temperaturs, whereby thermal deformation of the information recording medium is prevented, and
(5) Having an elongated pot life.

Owing to these characteristics of the adhesive used for sealing, the sealed type information recording medium of this invention has the excellent recording and reproducing characteristics and is also remarkably improved in productivity.

It is to be noted that the shape of substrates is not critical according to the present invention, although the description has been made hereinbefore with reference to disc substrates.

EXAMPLE

The present invention will be further described by the following examples, which examples are not to be construed as limiting the scope of the invention.

EXAMPLE 1

| Pentaerythritol hexaacrylate | 30 parts by weight |
|---|---|
| 2,2-bis(4-acryloxydiethoxy-phenyl)propane | 10 parts by weight |
| Tetrahydrofurfuryl acrylate | 10 parts by weight |
| Benzoin isobutyl ether | 2 parts by weight |
| Isopropyl alcohol | 50 parts by weight |
| Toluene | 10 parts by weight |

The above materials were well mixed by stirring and the mixture was dip coated to a pair of polymethyl methacrylate discs having a diameter of 200 mm and a thickness of 1.2 mm. After drying for 15 minutes, the coatings were irradiated with ultraviolet light from a 2 KW high pressure mercury lamp from a distance of 20 cm for a duration of 15 seconds.

Separately, a mixture of 100 parts by weight of 2,2-bis-(4-acryloxydiethoxyphenyl)propane and 3 parts by weight of benzoin isobutyl ether was dropped onto an Ni stamper, and the previously prepared respective discs were placed pressedly on said stamper and irradiated with ultraviolet light from a 2 KW high pressure mercury lamp from a distance of 20 cm for a duration of 30 seconds. The stamper was then removed by tearing off. The pattern on the stamper was faithfully transferred onto the acryl discs.

Then, 0.7% by weight solution of a cyanine dye NK-125 (made by Nippon Kanko Shikiso KK) in 2,2'-dichloroethane was prepared, and this solution was added with PA-1005 (made by Mitsui Toastu Fine Co., Ltd.) in an amount of 15% by weight based on the dye and coated on the stamper pattern transferrfed sides of said two acryl discs, followed by drying to form a 600 Å thick recording layer. This recording layer was subjected to a surface treatment comprising about 40-second ultrasonic cleaning with tetrahydrofuran solvent, succeeding ultrasonic cleaning with isopropyl alcohol for semiconductors and freon drying.

Then the thus treated discs were bonded to each other by an adhesive through the 1 mm thick polymethyl methacrylate-made inner and outer spacers and thereby sealed as shown in the drawing.

A photosetting composition of the following composition, i.e., Adhesive I, was used as the adhesive.

Adhesive I:

| ERL 4299 (available from UCC Corp.) | 8 parts by weight |
|---|---|
| Tris(ethylacetacetato)aluminum | 0.12 parts by weight |
| Tris(4-fluorophenyl)(o-nitrobenzyloxy)silane | 0.55 parts by weight |

Curing of this adhesive for effecting said sealing was conducted by irradiating the adhesive layer with ultraviolet light from a high pressure mercury lamp (UVL-2000-OS made by Ushio Electric Co., Ltd.) from a distance of 10 cm for a period of 50 seconds.

The thus produced sealed discs were kept in an environment of 60° C. and 90% RH for 2,000 hours and compared with a sample sealed by using a conventional ultraviolet-curing adhesive containing either a radical photopolymerization initiator or a cation polymerization initiator selected from onium salts, the counterions being $SbF_6^-$, $PF_6^-$, $As_2F_5^-$ and $BF_4^-$. There took place neither seepage of the adhesive to the dye recording layer due to uncuring of squeezed-out portion formed in the course of application of the adhesive nor bad influence on the dye recording layer due to the strong acid produced possibly from the counterions of said onium compound on curing the adhesive. Consequently, no difference was noted in reflectance and S/N ratio in comparison with another sample sealed by using a thermopolymerization type adhesive Lixonbond 1004A/B (made by CHISSO CO., LTD.).

COMPARATIVE EXAMPLE 1

The following Adhesive I' was prepared for the purpose of comparison with Adhesive I used in Example 1.

Adhesive I':

| ERL 4299 | 8 parts by weight |
|---|---|
| Tris(ethylacetacetato)aluminum | 0.12 parts by weight |
| Tris(4-chlorophenyl)(o-nitrobenzyloxy)silane | 0.55 parts by weight |

When sealing was conducted in the same way as in Example 1 by using Adhesive I' in place of Adhesive I, 60 seconds were required for curing by irradiation, and it was also found that Adhesive I cured faster than Adhesive I' and therefore could cure at a such much lower temperature.

In greater detail, both ultraviolet rays and infrared rays are emitted from a high pressure mercury lamp, and Adhesives I and I' absorb ultraviolet rays while the substrates absorb infrared rays and are raised in tempratrure. These two actions combine to effect curing. Therefore, the longer the irradiation time necessary for curing is, the higher temperature is required, so that in order to avoid the physical changes (such as surface deformation and occurrence of refringence) of the high-molecular compounds of the acryl substrates, it is necessary to shorten an irradiation time to minimize the rise of temperature.

The physical changes of the substrates can be avoided even at the curing rate in the case of Adhesive I', but when using Adhesive I, the curing rate becomes higher and hence curing can be effected at a lower temperature, so that in this case it is possible to avoid the physical changes of the substrate more positively.

As for the pot life at room temperature (21° C.), Adhesive I kept for as many as 10 days while Adhesive I' cured couldn't outlast 7 days.

Incidentally, when said Adhesives I and I' were applied dropwise onto a polycarbonate plate and exposed to ultraviolet light from a distance of 16 cm at a temperature of as low as 40° C. by using said high pressure mercury lamp and a cold mirror (reflecting ultraviolet rays but transmitting infrared rays), Adhesive I cured in 60 seconds while Adhesive I' required 75 seconds to cure.

As viewed above, Adhesive I according to this invention can cure faster at low temperaturs and is also longer in pot life than a conventional Adhesive I'. Thus, with Adhesive I, it is possible to avoid more positively the physical changes (such as surface deformation and occurrence of refringence) of the acryl substrates and to also improve the article productivity.

EXAMPLE 2

A solution consisting of 20 parts by weight of 1,2-dichloroethane containing 1% by weight of a cyanine dye of the following structure, 78 parts by weight of methanol, 3 parts by weight of isopropyl alcohol and 0.5 part by weight of n-butanol was added with 0.15% by weight of a light stabilizer having the following structure, and the resulting solution was applied to each of two 200 mm-diameter and 1 mm thick polycarbonate substrates having guide grooves and dried to form a 600 Å thick recording layer.

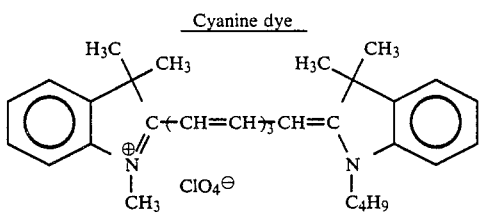

Cyanine dye

Then, the substrates were bonded to each other and sealed through 1 mm thick ABS spacers by using adhesive layers as shown in the drawing to obtain a recording medium. The adhesive used for forming the adhesive layers was of the following composition, i.e., Adhesive II.

Adhesive II:

| | |
|---|---|
| ERL 4299 | 3.6 parts by weight |
| Spiroepoxy | 1.2 parts by weight |
| EHPE-3150 | 1.2 parts by weight |
| Tris(4-fluorophenyl)(o-nitrobenzyloxy)silane | 0.41 parts by weight |
| Tris(ethylacetacetato) aluminum | 0.089 parts by weight |

Said adhesive composition was cured by irradiating with ultraviolet light from a distance of 10 cm for a duration of 60 seconds by using a high pressure mercury lamp (UVL-2000-OS made by Ushio Electric Co., Ltd.), whereby the adhesive layers were formed.

The thus produced sealed disc type recording medium was kept under an environment of 60° C. and 90% RH for 2,000 hours and compared with a sample sealed by using a conventional ultraviolet-curing adhesive containing either a radical photopolymerization initiator or a cation polymerization initiator selected from onium salts, the counterions being $SbF_6^-$, $PF_6^-$, $AsF_5^-$ and $BF_4^-$. In the former, even the squeezed-out portion of the adhesive was perfectly cured, causing no seepage of the adhesive into the dye recording layer, and in addition there took place no bad influence on the dye recording layer due to the strong acid produced possibly from the counterions of said onium compound on curing the adhesive, and there was noted almost no difference in reflectance and S/N ratio in comparison with the same conventional sample sealed by using Lixonbond 1004A/B (available from CHISSO CO., LTD.) as in Example 1.

Even when the sealed discs of Examples 1 and 2 were kept in said environment of 60° C. and 90% RH for half a year, the polycarbonate substrates and ABS spacers remained bonded very firmly to each other.

COMPARATIVE EXAMPLE 2

The following adhesive was prepared for the purpose of comparison with Adhesive II used in Example 2.

Adhesive II':

| | |
|---|---|
| ERL 4299 | 3.6 parts by weight |
| EHPE-3150 | 1.2 parts by weight |
| Spiroepoxy | 1.2 parts by weight |
| Tris(ethylacetacetato)aluminum | 0.090 parts by weight |
| Tris(4-chlorophenyl)(o-nitrobenzyloxy)silane | 0.45 parts by weight |

When the same sealing operations as in Example 2 were conducted by using Adhesive II' instead of Adhesive II, 65 seconds were required for curing. Thus, Adhesive II cured faster than Adhesive II' and therefore could cure at a correspondingly lower temperature.

The pot life of Adhesive II at room temperature (21° C.) was approximately 40 days while that of Adhesive II' was approximately 19 days, or about half that of Adhesive II.

Incidentally, when Adhesives II and II' were applied dropwise onto a polycarbonate plate and exposed to ultra-violet light from a distance of 16 cm at a low temperature of as low as 45° C. by using a high pressure mercury lamp and a cold mirror as in Comparative Example 1, Adhesive II cured in 75 seconds while Adhesive II' required 90 seconds to cure.

In sum, Adhesive II cures faster than Adhesive II', can therefore cure at a correspondingly lower temperature and also has a longer pot life, so that by using Adhesive II it is possible not only to avoid the physical changes (surface deformation and occurrence of refringence) of the PC subtrates but also to improve the article productivity.

EXAMPLES 3 and 4

A solution consisting of 25 parts by weight of 1,2-dichloroethane containing 0.75% by weight of a cyanine dye of the following structure, 80 parts by weight of methanol, 20 parts by weight of isopropyl alcohol, 5 parts by weight of n-butanol and 18 parts by weight of methoxyethanol was added with 0.11% by weight of a light stabilizer of the following structure, and this resulting solution was applied to each of two 130 mm-diameter and 1 mm thick polycarbonate substrates with guide grooves and dried to form a 600 Å recording layer.

Cyanine Dye

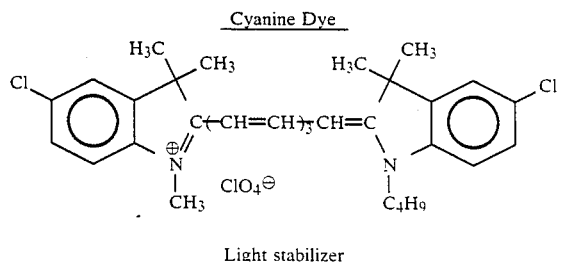

Light stabilizer

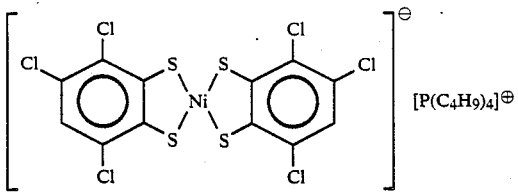

Then the thus trated substrates were bonded to each other through 1 mm thick ABS spacers by using adhesive layers to obtain a recording medium.

Adhesives III and IV used for forming the adhesive layers were of the compositions shown in the following table.

TABLE 1

| Example | Adhesive | ERL 4299 (available from UCC) | Tris (ethyl-acetacetato) aluminum | Tris(4-fluorophenyl)(o-nitrobenzyloxy)-silane | (o-nitrobenzyloxy) triphenyl-silane |
|---|---|---|---|---|---|
| 3 | III | 8 parts by weight | 0.2 parts by weight | 0.55 parts by weight | 0.25 parts by weight |
| 4 | IV | 8 parts by weight | 0.2 parts by weight | 0.40 parts by weight | 0.40 parts by weight |

Curing of Adhesives III and IV was accomplished by irradiating the adhesive layers with ultraviolet light from a distance of 10 cm for durations of 45 seconds and 42 seconds, respectively, by using a high pressure mercury lamp (UVL-2000-OS made by Ushio Electric Co., Ltd.).

The curing times were shorter than that (50 seconds) of Adhesive I in Example 1, and therefore curing could be effected at a so much lower temperature.

The thus produced sealed discs of Examples 3 and 4 were kept under an environment of 60° C. and 90% RH for 2,000 hours and compared with a sample sealed by using a conventional ultraviolet-curing adhesive containing either a radical photopolymerization initiator or a cation polymerization initiator selected from onium salts, the counterions being $SbF_6^-$, $PF_6^-$, $As_2F_5^-$ and $BF_4^-$. In both cases, there took place neither seepage of the adhesive into the dye recording layer due to uncuring of the squeezed-out portion formed in the course of application of adhesive nor bad influence on the dye recording layer due to the strong acid produced possibly from the counterions of said onium compound on curing the adhesive, and therefore there was noted almost no difference in reflectance and S/N ratio in comparison with a sample sealed by using a known thermopolymerized adhesive Lixonbond 1004A/B (made by CHISSO CO., LTD.).

The sealed discs of Examples 3 and 4 were kept in an enviornment of 60° C. and 90% RH for half a year, but the polycarbonate substrates and ABS spacers stayed bonded to each other very strongly.

When the compositions of Adhesives III and IV were applied dropwise onto a polycarbonate plate and exposed to ultraviolet light from a distance of 16 cm at 40° C. by using a high pressure mercury lamp (UVL-2000-OS made by USHIO ELECTRIC CO., LTD.) and a cold mirror (which transmits infrared rays but reflects ultraviolet rays), said compositions cured in 55 seconds and 53 seconds, respectively. Also, when the pot life of these compositions was measured by allowing them to stand at normal temperature, substantially no change of quality was produced in both of them through a period of 9 days.

In sum, both of the compositions of Adhesives III and IV, as compared with the composition of Adhesive I, are substantially the same in pot life but still higher in curing speed. Therefore, said Adhesives III an IV can be cured at an even lower temperature than required for Adhesive I, thus enabling even more positive avoidance of the physical changes (surface deformation and occurrence of refringence) of polycarbonate substrates and further enhancement of article productivity.

What is claimed is:

1. An optical information recording medium comprising a pair of substrates at least one of which has a recording layer on a part of one side thereof, which are placed opposingly to each other so that said recording layer is positioned on the inside and which are bonded to each other by photopolymerizable adhesive layer(s) with or without spacer(s) therebetween to form a sealed structure, said adhesive layer being composed of a cured adhesive formed from a composition comprising (a) an epoxy resin, (b) a photolyzable organosilicon compound of 0.5 to 15% by weight based on the epoxy resin, which is represent by the following formula (I):

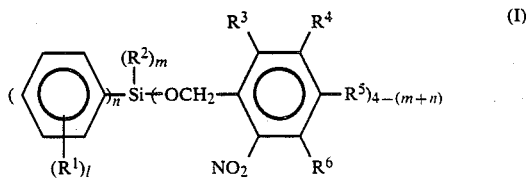

(wherein $R^1$ represents a fluorine atom; $R^2$ represents a lower alkyl group, a lower unsaturated alkyl group and aromatic group, and is the same or different from each other when m is 2; $R^3$, $R^4$, $R^5$ and $R^6$ are the same or different from each other and represent a hydrogen atom, a halogen atom, an alkyl group, an aryl group, a nitro group, a cyano group and an alkoxy group; l is an integer of 1 to 5; m is 0, 1 and 2; and n is an integer of 1 to 3, but $m+n \leq 3$), and (c) an aluminum complex compound of 0.01 to 10% by weight based on the epoxy resin.

2. An optical information recording medium according to claim 1, wherein an amount of the photolyzable organosilicon compound is 0.5 to 12% by weight based on the epoxy resin and an amount of the aluminum complex compound is 0.5 to 5% by weight based on the epoxy resin.

3. An optical information recording medium comprising a pair of substrates at least one of which has a recording layer on a part of one side thereof, which are placed opposingly to each other so that said recording layer is positioned on the inside and which are bonded to each other by photopolymerizable adhesive layer(s) with or without spacer(s) therebetween to form a sealed structure, said adhesive layer being composed of a cured adhesive formed from a composition comprising (a) an epoxy resin, (b) a photolyzable organosilicon composition of 0.55 to 37.5% by weight based on the epoxy resin, which the photolyzable organosilicon composition comprises a mixture of (b-1) a photolyzable organosilicon compound represented by the following formula (I):

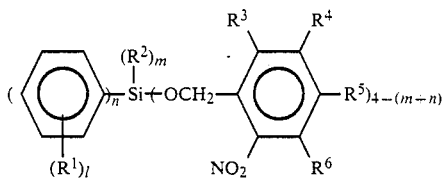

(wherein $R^1$ represents a fluorine atom: $R^2$ represents a lower alkyl group, a lower unsaturated alkyl group and aromatic group, and is the same or different from each other when m is 2; $R^3$, $R^4$, $R^5$ and $R^6$ are the same or different from each other, and represent a hydrogen atom, a halogen atom, an alkyl group, an aryl group, a nitro group, a cyano group and an alkoxy group; l is an integer of 1 to 5; m is 0, 1 and 2; and n is an integer of 1 to 3, but $m+n\leq 3$), and (b-2) a silicon compound having at least one phenyl group having no substituents and at least one o-nitrobenzyloxy group having a substituent or no substituents, the amount of the silicon compound being in the range of from 0.1 to 1.5 times by weight as large as the photolyzable organosilicon compound, and (c) an aluminum complex compound of 0.01 to 10% by weight based on the epoxy resin.

4. An optical information recording medium according to claim 3, wherein an amount of the photolyzable organosilicon composition is 0.60 to 30% by weight based on the epoxy resin and an amount of the aluminum complex compound is 0.5 to 5% by weight based on the epoxy resin.

5. An optical information recording medium according to claim 3, wherein the silicon compound (b-2) is and o-nitrobenzylsilyl ether compound.

* * * * *